United States Patent [19]
Sano et al.

[11] Patent Number: 4,803,486
[45] Date of Patent: Feb. 7, 1989

[54] MATRIX SWITCH CIRCUIT

[75] Inventors: Shinichi Sano; Yasuhito Takeuchi; Yoshiro Tamezumi; Takao Higashiizumi; Tsuyoshi Kakizawa, all of Tokyo, Japan

[73] Assignee: Yokogawa Medical Systems, Limited, Tokyo, Japan

[21] Appl. No.: 159,487

[22] Filed: Feb. 22, 1988

Related U.S. Application Data

[63] Continuation of Ser. No. 920,999, filed as PCT JP86/00066 on Feb. 14, 1986, published as WO86/05049 on Aug. 28, 1986, abandoned.

[30] Foreign Application Priority Data

Feb. 15, 1985 [JP] Japan .................................. 60-27769

[51] Int. Cl.$^4$ ............................................. H04Q 1/00
[52] U.S. Cl. .................... 340/825.79; 73/628
[58] Field of Search ...................... 379/356; 368/69, 70; 340/365.5, 765, 784, 825.79; 128/660; 73/570, 587, 586, 596, 607, 609, 610, 618, 628, 633

[56] References Cited

U.S. PATENT DOCUMENTS

| | | | |
|---|---|---|---|
| 4,065,916 | 6/1978 | Leuschner | 368/70 |
| 4,182,108 | 1/1980 | Chihara | 368/70 |
| 4,196,582 | 4/1980 | Hersberger et al. | 368/70 |
| 4,542,379 | 9/1985 | Satou | 340/765 X |

FOREIGN PATENT DOCUMENTS 54-35645 3/1979 Japan .
54-109342 8/1979 Japan .

Primary Examiner—Ulysses Weldon
Attorney, Agent, or Firm—Moonray Kojima

[57] ABSTRACT

An improved matrix switch circuit comprising an array of analog switches disposed in the form of a matrix and one or more control memories for storing control signals which cause their respective switches of the array to open or close. An interface is provided between the control memories and the array of the switches. The interface receives the control signals from the control memories and holds them. The held signals are then supplied to the switches of the array. While the switches of the array are being controlled according to the control signals held in the interface, the contents of the control memories can be changed at any desired instant.

1 Claim, 6 Drawing Sheets

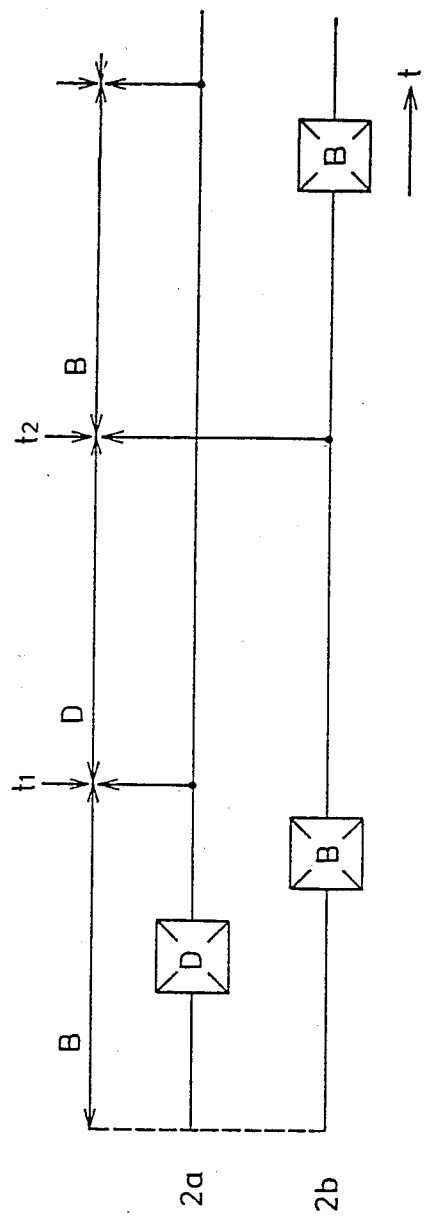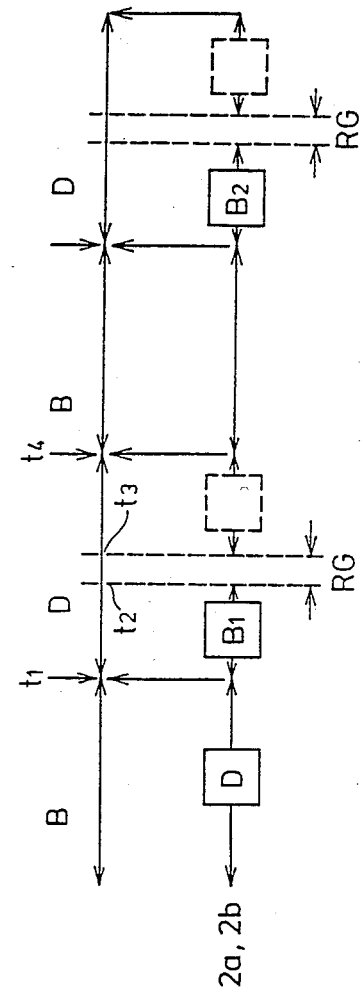

MATRIX SWITCH CIRCUIT

This application is a continuation of application Ser. No. 66/920999 filed as PCT JP86/00066 on Feb. 14, 1986, published as WO86/05049 on Aug. 28, 1986, now abandoned.

TECHNICAL FIELD

The present invention relates to a matrix switch circuit adapted for use as a delay map former that is employed in an ultrasonograph of the phase array sector scan type.

BACKGROUND ART

An ultrasonograph of the phase array sector scan type comprises a phased array of ultrasonic transducers that are brought into contact with an object to be examined. Ultrasonic beams are emitted into the object from the transducers at successively differing angles to make a sector scan. The resultant echo signals are processed to obtain an ultrasonogram of the object. The echo signals received by the transducers are put in phase via a delay map former having delay elements whose delay times are controlled according to the respective echo signals. Thus, the directivity pattern of reception is matched to the direction of emission of ultrasound. This delay map former consists of a combination of a matrix switch and a tapped delay circuit.

FIG. 10 is a block diagram of the conventional matrix switch that is used to build a delay map former. The switch has an address decoder 1 for decoding the incoming address signal, a control memory 2 that receives data regarding addresses from the decoder 1, and an analog switch array 3 which is controlled by the signal from the memory 2. In this specific apparatus, the array 3 consists of a matrix of $8 \times 8$ switches. The decoder 1 receives ADDRESS ENABLE signal AE and address signals $A_0$-$A_2$. The memory 2 can consist, for example, of a memory whose contents can be rewritten, such as a random-access memory. Data items $D_0$-$D_7$ are written to the memory 2 at addresses specified by the address decoder 1, according to the ADDRESS ENABLE signal. There exist 8 address lines to which the 8 data items $D_0$-$D_7$ are respectively written. Thus, 64 data items are stored in the memory 2. The whole contents of the memory are reset by MASTER RESET signal MR. The analog switch array 3 consists of a matrix of switches, 64 switches in this case, disposed at the intersections of vertical lines (junctors) and horizontal lines. These switches are closed or opened, according to their respective output signals from the memory 2. Indicated by $V_{DD}$, $V_{EE}$, and $V_{SS}$ are supply voltages.

Echo signals received by a plurality of ultrasonic transducers are supplied either to the vertical lines $J_0$-$J_7$ or to the horizontal lines $L_0$-$L_7$, respectively. Those lines which are not fed with the echo signals are connected with the taps of a tapped delay circuit (not shown). Data concerning a desired delay map is written to the control memory 2 to selectively close the switches of the array 3. Thus, the echo signals received by the transducers are delayed by periods matched to a desired directivity of reception.

In the conventional matrix switch circuit constructed as described above, the vertical and horizontal lines are selectively enabled, according to the contents of the control memory 2. Therefore, even when the contents of the memory 2 are being altered, the switches of the array are selectively closed, according to the present contents of the memory. However, the contents of the memory 2 make no meaning until the contents of the memory are fully rewritten. For this reason, it is necessary to inhibit the vertical or horizontal lines while the contents of the memory 2 are being rewritten.

In order to successively switch the directivity of reception to each of a number of characteristics in step with a sector scan using ultrasonic beams, the data stored in the memory 2 is rewritten each time one echo signal is received as shown in FIG. 11. It is now assumed that an echo signal is received from instant $t_1$ to instant $t_2$, using a delay map. Thereafter, neither the transmission of ultrasonic nor the reception of echo signals is performed during the interval between instant $t_2$ and instant $t_3$. During this interval, the data stored in the memory 2 is rewritten, according to the directivity of the next echo reception. Where a hundred $8 \times 8$ matrix switches are used in combination to make use of 6400 switches in total, about 40 $\mu$s is taken to rewrite the contents of the memory 2. This has made it impossible to send and receive ultrasonic waves at a high rate.

DISCLOSURE OF THE INVENTION

It is the object of the present invention to provide a matrix switch circuit which permits the contents of the control memory to be rewritten without affecting the closure or opening of vertical and horizontal lines, thus allowing the signal flow between the vertical and horizontal lines to persist even during rewriting of the contents of the memory.

In one feature of the invention, an interface is provided between a control memory and an array of analog switches so that the contents of the memory are momentarily read out and held in the interface. The held signal is used to control the closure or opening of each of the switches of the array.

BRIEF DESCRIPTION OF THE DRAWINGS

FIGS. 3-6 are timing charts for illustrating the operation of the circuit shown in FIG. 1;

BEST MODE FOR CARRYING OUT THE INVENTION

Figure 1:
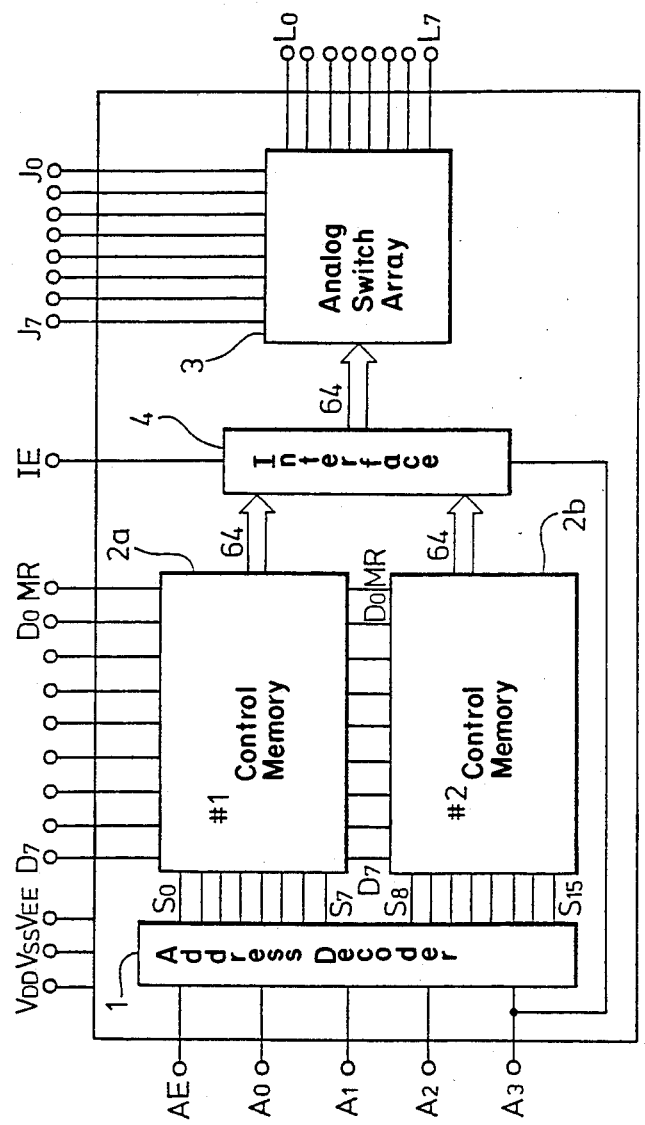
FIG. 1 is a block diagram of a matrix switch circuit according to the invention.
Figure 10:
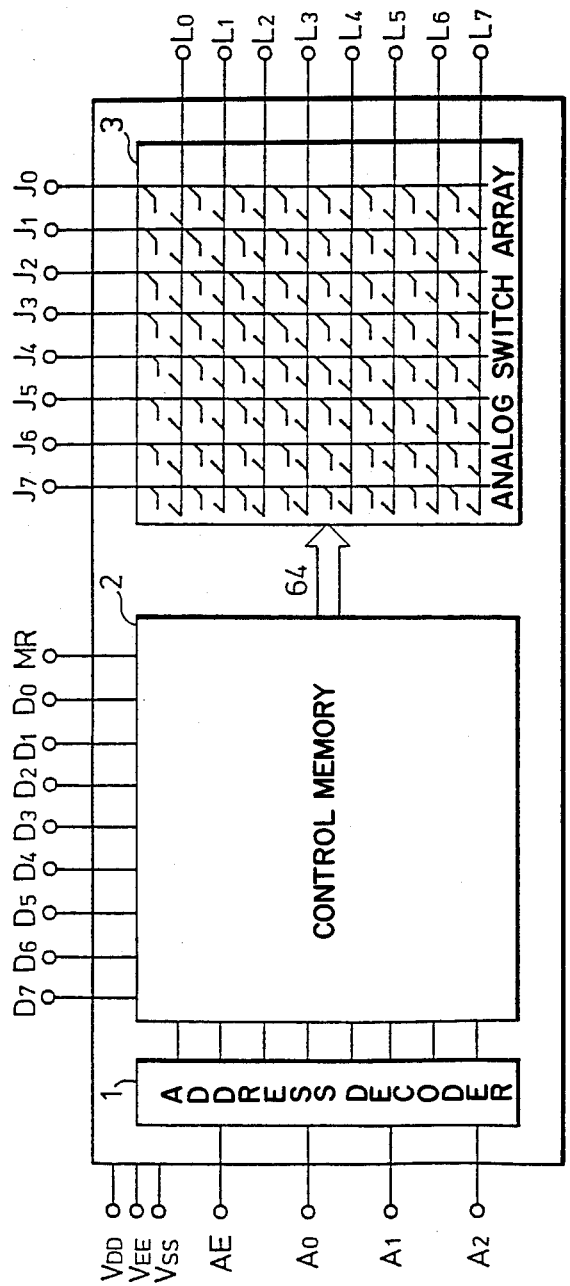
FIG. 10 is a block diagram of the conventional matrix switch circuit.

Referring to FIG. 1, there is shown a matrix switch circuit embodying the concept of the invention. This circuit is similar to the conventional circuit shown in FIG. 10 except that a first control memory $2a$, a second control memory $2b$, and an interface 4 are provided. The first memory $2a$ receives ADDRESS LINE SELECT signals $S_0, S_1, \ldots, S_7$ from address decoder 1, while the second memory $2b$ receives ADDRESS LINE SELECT signals $S_8, S_9, \ldots, S_{15}$ from the decoder 1. The data read from the memories $2a$ and $2b$ is fed to analog switch array 3 via the interface 4. The decoder 1 receives ADDRESS ENABLE signal AE and address signals $A_0$-$A_3$ and deliver ADDRESS LINE SELECT signals $S_0$-$S_{15}$. Data signals $D_0$-$D_7$ and MASTER RESET signal MR are applied to both memories 2a and 2b. Each of the memories 2a and 2b delivers 64 data items to control the switches of the array.

The interface 4 receives the output signal from the memories 2a, 2b, INTERFACE ENABLE signal IE, and most significant address signal $A_3$. The interface 4 delivers 64 signals to the array 3 to control the matrix of the switches. The decoder 1, the memories 2a, 2b, and the interface 4 handle digital signals. The array 3 interconnects some of input lines $L_0$–$L_7$ and output lines $J_0$–$J_7$ via those switches which are closed in response to the control signals from the interface 4. Analog signals are allowed to pass through the interface via the interconnected lines.

The apparatus constructed as described above operates in the manner described below. When ADDRESS ENABLE signal AE goes high, the address signals $A_0$–$A_3$ applied to the address decoder 1 are decoded, and one of LINE SELECT signals $S_0$–$S_{15}$ goes high. The most significant bit $A_3$ of the address signals acts as a BANK SELECT signal that determines to which of the first and second control memories is data written. The selected memory 2a or 2b writes data items $D_0$–$D_7$ to those address lines whose corresponding LINE SELECT signals go high, and stores them. The LINE SELECT signals are successively caused to go high in order to sequentially write data to the address lines. In this example, after data has been written to both memories 2a and 2b, it follows that 128 data items in total are stored in them. The memories 2a and 2b can be reset by supplying MASTER RESET signal MR to them as the need arises.

The interface 4 selects the 64 matrix switch control signals from the memory 2a or 2b that is not selected by the aforementioned BANK SELECT signal. When INTERFACE ENABLE signal IE is at high level, the interface 4 accepts the selected signals. Then, the signals are held in the holding means (not shown) of the interface and supplied to the array 3 to control the switches. In this way, each of 8×8 switches of the array 3 is closed or opened, depending on the control signals from the interface 4. As a result, the vertical and horizontal lines are selectively enabled, according to the data previously written to the control memories.

Figure 2:
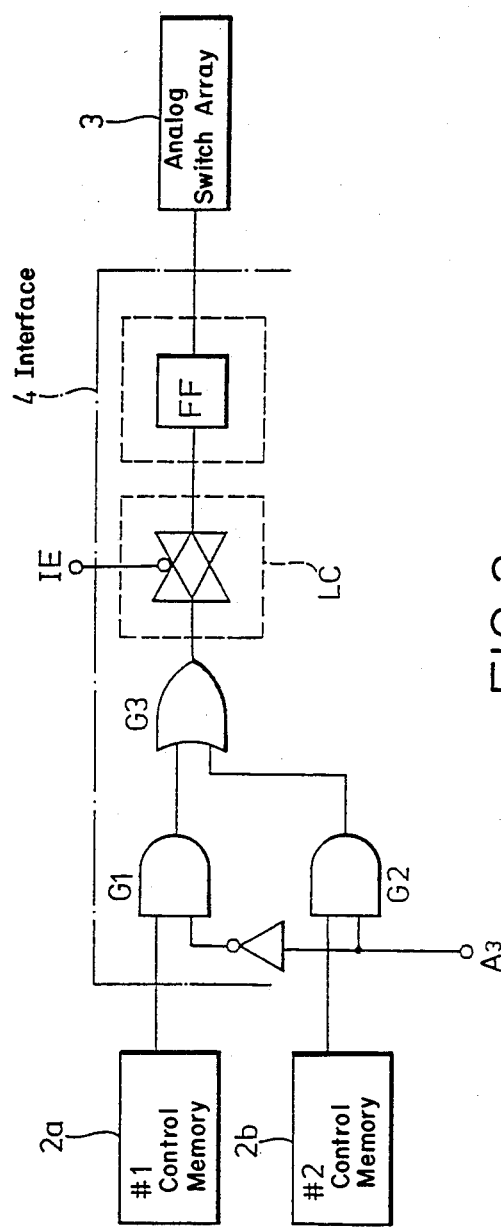
FIG. 2 is a block diagram of one example of the interface shown in FIG. 1.

FIG. 2 is a block diagram of one example of the interface 4 shown in FIG. 1. The illustrated circuit corresponds to one of the data items delivered from one control memory. In reality, 64 similar circuits are incorporated in the interface 4. The circuit shown in FIG. 2 comprises an AND gate G1, another AND gate G2, an OR gate G3 that ORs the output signals from the gates G1 and G2, a switch circuit LC that interrupts the output from the OR gate G3 according to INTERFACE ENABLE signal IE, and a flip-flop FF for storing the signal passed through the switch circuit LC. The control signal from the first control memory 2a is applied to one input terminal of the AND gate G1, whose other inverted terminal receives the most significant address signal $A_3$. The control signal from the second control memory 2b is applied to one input terminal of the AND gate G2, the other non-inverted terminal of which receives the most significant address signal $A_3$.

In the operation of the interface 4 constructed as described above, the AND gate G1 or G2 selects either the control signal from the first memory 2a or the control signal from the second memory 2b, depending on the most significant address signal $A_3$. The selected control signal is stored in the flip-flop FF by INTERFACE ENABLE signal IE, and is also applied to the analog switch array 3. Therefore, each of the switches of the array 3 is closed or opened according to the data stored in the flip-flop FF. This condition is maintained even after INTERFACE ENABLE signal IE is inverted, isolating the switch circuit LC. At this time, therefore, the contents of the memories 2a and 2b can be changed without affecting the closure or opening of each switch of the array 3. A capacitor can be used as the means for holding the matrix switch control signal, instead of the flip-flop FF. In this case, the capacitor may make use of the stray capacitance of the control signal lines for the switches.

Figure 3:
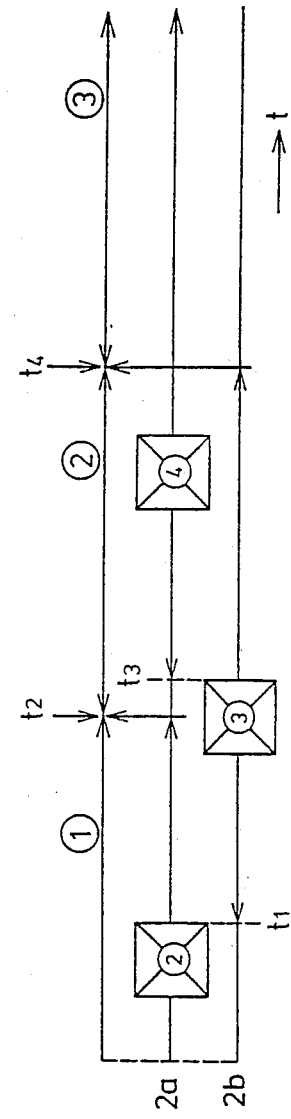

The novel matrix switch circuit can be utilized as a delay map former for an ultrasonograph in the manner described below. Referring to the timing chart of FIG. 3, the contents of the first and second control memories 2a and 2b can be changed at any desired instant simultaneously with reception of echo signals. More specifically, when echo signals are being received in mode 1 in response to the control signal held in the holding means of the interface 4, the contents of the control memory 2a are changed for the next mode 2. The operation in mode 2 is started at instant $t_2$. At this instant, the contents of the memory 2a are transferred to the holding means of the interface 4. The closure or opening of each switch of the array is varied for the mode 2. With respect to the memory 2b, a control signal for mode 3 is written to the memory 2b during the interval between the instant $t_1$ at which the writing of data to the memory 2a is completed and the instant $t_4$ at which the reception of echo signals in mode 3 is initiated. The written data is transferred to the holding means of the interface 4 at the instant $t_4$. After the completion of the writing of data to the memory 2b, the memory 2a whose contents were transferred to the holding means at instant $t_2$ is capable of starting to accept data for mode 4 at the instant $t_3$.

FIG. 4 is a timing chart for illustrating the operation of a sector scan type ultrasonograph with which the novel matrix switch circuit is used. The ultrasonograph utilizes Doppler mode. In this case, a control signal for B mode and a control signal for D (Doppler) mode are alternately mapped onto the memories 2a and 2b. While echo signals are being received in D mode in which weak signals are handled, the contents of neither control memory are changed. This prevents the occurrence of noise which would otherwise be produced by altering the contents of the memories. The delay map used in B mode differs among every echo reception, but the delay map used in D mode remains the same for every echo reception unless the sample position is altered. Accordingly, it is only necessary that the memory 2a be initialized; the contents of this memory are not required to be modified. The delay map for B mode can be varied during the period of reception of echo in D mode, if this period does not lie within range gate period RG as shown in FIG. 5.

Figure 6:
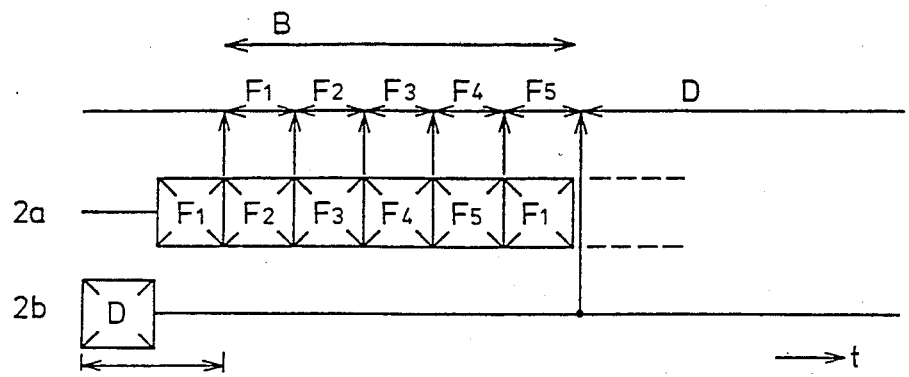

Referring next to FIG. 6, a real-time dynamic focusing can be performed for a sector scan. Specifically, when echo signals are being received in B mode, data items which cause the received waves to produce different focal lengths $F_1$, $F_2$, $F_3$, etc. are successively written to one control memory 2a. Then, they are transferred to the holding means of the interface 4. Where the reception of a single echo signal persists for 200 μs and 40 μs is taken to rewrite the delay map, dynamic focusing of five stages can be achieved.

Figure 7:
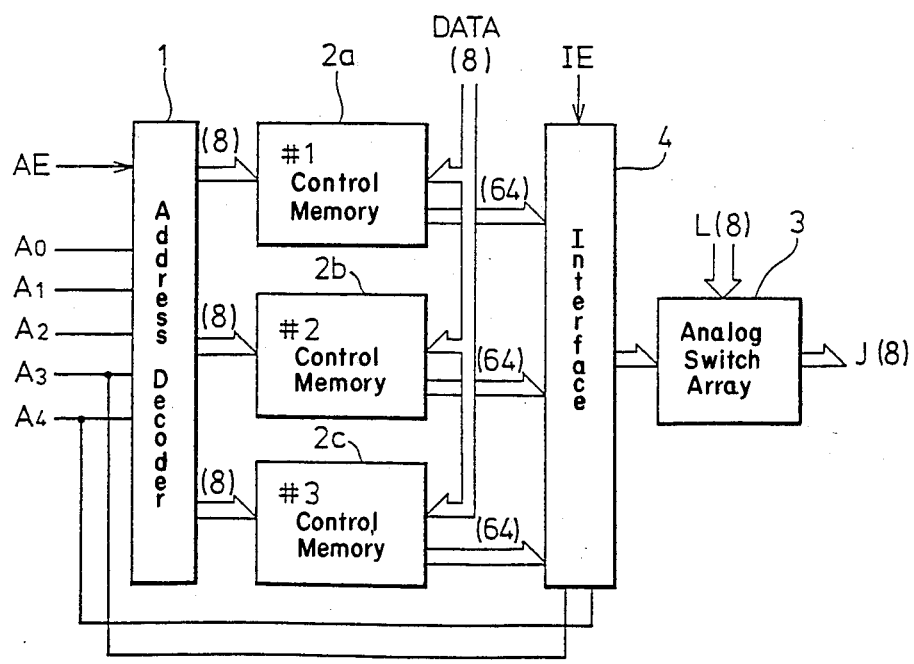
FIGS. 7 and 8 are block diagrams of other matrix switch circuits according to the invention.
Figure 8:
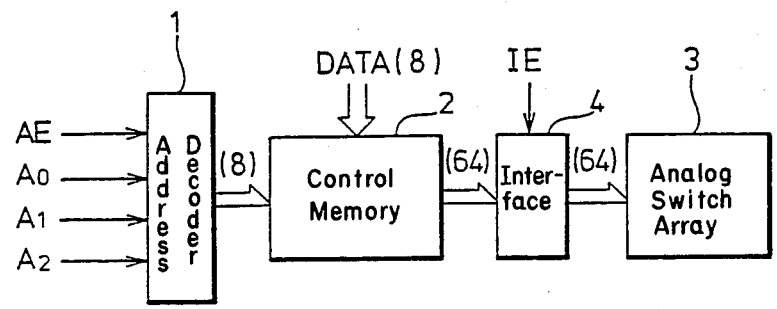

FIGS. 7 and 8 are block diagrams of other examples of the invention. In the example of FIG. 7, three control memories 2a, 2b, 2c are provided. The interface 4 selects one out of the control signals from the memories 2a–2c, in response to the most significant two bits $A_3$ and $A_4$ of the address signal.

Figure 9:
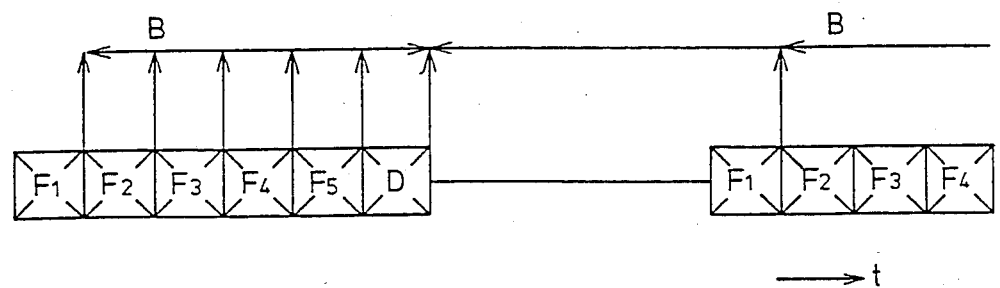
FIG. 9 is a timing chart for illustrating the operation of the circuit shown in FIG. 8.
Figure 11:
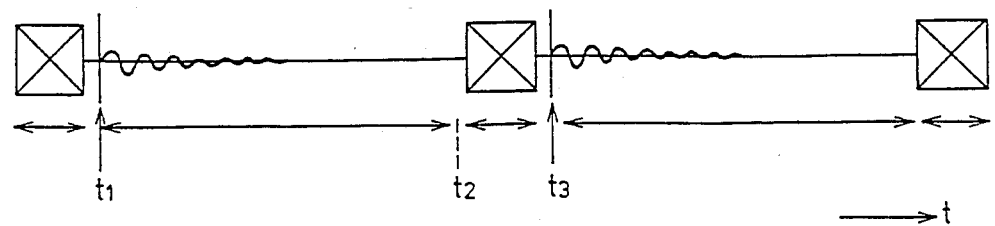
FIG. 11 is a timing chart for illustrating the operation of the conventional circuit shown in FIG. 10.

The example of FIG. 8 uses a single control memory. While the array 3 of the analog switches is being controlled according to the contents of the holding means of the interface 4, the contents of the control memory 2 are changed. FIG. 9 is a timing chart for illustrating the operation for receiving echo signals in B and D modes in according with this example.

As described thus far, the novel matrix switch circuit permits the contents of at least one control memory to be changed while maintaining the condition of the vertical and horizontal lines, i.e., allowing signals to pass through the switches.

Where the delay map former of an ultrasonograph is built using the novel matrix switch circuit, one mode can be momentarily switched to another without delay which would have otherwise be introduced due to rewriting of data to the control memories.

While the best mode for carrying out the invention has been described, it should be understood by those skilled in the art that various changes and modifications may be made without departing from the inventive concepts which are delineated by the following claims.

I claim:

1. A delay map former circuit for use in ultrasonography, comprising
   an array of a plurality of analog switches disposed at the intersection of a plurality of plurality of vertical and horizontal signal lines;
   a first memory means for storing control signals for closing and opening respective ones of the analog switches of said array;
   control means for generating an interface enable signal and a most significant address signal; and
   interface means connected between said array of analog switches and said first and second memory means and under the control of said control means for selectively controlling said analog switches according to control signals stored in said first and second memory means;
   wherein said interface comprises
      a first AND circuit connected to said control means and to said first memory means,
      a second AND circuit connected to said control means and to said second memory means,
      a single switching means connected commonly to said first and second AND circuits and to said control means, and
      a single holding means connected to said switching means and to said array; and
   wherein said control means applies said most significant signal to said first and second AND circuits to select one of said first and second AND circuits for transmitting control signals therethrough
   wherein said control means applies said interface enable signal to said switching means to cause said control signals from the selected one of said first and second memory means to be transmitted through said switching means to said holding means, said holding means holding the transmitted control signals, and then applying the held control signals to selectively control selected ones of said analog switches of said array,
   wherein said control means enters control signals into said selected one of said first and second memory means after transmission of stored control signals through said AND circuits and said switching means to said holding means, and
   wherein said control means causes control signals stored in another of said first and second memory means to be transmitted through said AND circuits and said switching means to said holding means, after selected control signals are transmitted to said holding means to operate selected ones of said analog switches of said array, so that entering of control signals into said first and second memory means is independent of the selective operation of said analog switches of said array.

* * * * *